US006945827B2

(12) United States Patent
Grube et al.

(10) Patent No.: US 6,945,827 B2
(45) Date of Patent: Sep. 20, 2005

(54) MICROELECTRONIC CONTACT STRUCTURE

(75) Inventors: Gary W. Grube, Pleasanton, CA (US); Gaetan L. Mathieu, Livermore, CA (US); Alec Madsen, Oakland, CA (US)

(73) Assignee: FormFactor, Inc., Livermore, CA (US)

( * ) Notice: Subject to any disclaimer, the term of this patent is extended or adjusted under 35 U.S.C. 154(b) by 79 days.

(21) Appl. No.: 10/328,083

(22) Filed: Dec. 23, 2002

(65) Prior Publication Data

US 2004/0121627 A1 Jun. 24, 2004

(51) Int. Cl.[7] .............................................. H01R 13/24
(52) U.S. Cl. ...................................... 439/700; 361/761
(58) Field of Search ................................ 439/700, 824; 361/761

(56) References Cited

U.S. PATENT DOCUMENTS

| 3,654,585 A | 4/1972 | Wickersham |
| 4,418,857 A | 12/1983 | Ainslie et al. |
| 4,622,514 A | 11/1986 | Lewis |
| 4,965,865 A | * 10/1990 | Trenary ...................... 324/754 |
| 5,032,787 A | 7/1991 | Johnston et al. |
| 5,124,646 A | 6/1992 | Shiraishi |
| 5,148,103 A | 9/1992 | Pasiecznik, Jr. |
| 5,195,237 A | 3/1993 | Cray et al. |
| 5,225,777 A | 7/1993 | Bross et al. |
| 5,308,443 A | 5/1994 | Sugihara |
| 5,354,712 A | 10/1994 | Ho et al. |
| 5,366,380 A | 11/1994 | Reymond |
| 5,367,254 A | 11/1994 | Faure et al. |
| 5,399,982 A | 3/1995 | Driller et al. |
| 5,476,818 A | 12/1995 | Yanof et al. |
| 5,513,430 A | 5/1996 | Yanof et al. |
| 5,534,787 A | 7/1996 | Levy |
| 5,555,422 A | 9/1996 | Nakano |
| 5,573,435 A | 11/1996 | Grabbe et al. |
| 5,600,257 A | 2/1997 | Leas et al. |
| 5,629,631 A | 5/1997 | Perry et al. |
| 5,686,842 A | 11/1997 | Lee |
| 5,806,181 A | 9/1998 | Khandros et al. |
| 5,821,763 A | 10/1998 | Beaman et al. |

(Continued)

FOREIGN PATENT DOCUMENTS

| CH | 661129 A5 | 10/1983 |
| DE | 3129568 A1 | 4/1982 |
| DE | 101 51 125 A1 | 6/2002 |
| EP | 463684 B1 | 4/1996 |
| EP | 1 365 250 A1 | 11/2003 |
| JP | 61-19770 | 2/1986 |
| JP | 62-197073 | 12/1987 |
| JP | 05-218156 | 8/1993 |
| JP | 06-50990 | 2/1994 |
| JP | 07-021968 | 1/1995 |
| JP | 07-333232 | 12/1995 |
| JP | 2001-052827 | 2/2001 |
| TW | 334607 | 6/1998 |

Primary Examiner—Thanh-Tam Le
(74) Attorney, Agent, or Firm—N. Kenneth Burraston

(57) ABSTRACT

An elongate, columnar micro-mechanical structure disposed along a central longitudinal axis; the structure is made up of laminated structural layers, each comprised of a structural material. The layers define a substantially rigid base portion at a proximal end of the structure, a resilient intermediate portion extending from the base portion along the central axis, and a contact tip extending from the resilient portion at a distal end of the structure. The resilient portion of the contact structure is comprised of resilient arms defined in the layers. Opposite ends of the resilient arms may be angularly offset with respect to one another around the central axis. Accordingly, when the contact structure is compressed in an axial direction, the contact tip will rotate around the central axis, while the base remains fixed, providing beneficial wiping action to the contact tip.

16 Claims, 16 Drawing Sheets

U.S. PATENT DOCUMENTS

| | | |
|---|---|---|
| 5,828,226 A | 10/1998 | Higgins et al. |
| 5,829,128 A | 11/1998 | Eldridge et al. |
| 5,917,707 A | 6/1999 | Khandros et al. |
| 5,974,662 A | 11/1999 | Eldridge et al. |
| 6,014,032 A | 1/2000 | Maddix et al. |
| 6,031,282 A | 2/2000 | Jones et al. |
| 6,051,982 A | 4/2000 | Alcoe et al. |
| 6,059,982 A | 5/2000 | Palagonia et al. |
| 6,072,190 A | 6/2000 | Watanabe et al. |
| 6,083,059 A | 7/2000 | Kuan |
| 6,087,840 A | 7/2000 | Mizuta |
| 6,144,212 A | 11/2000 | Mizuta |
| 6,150,830 A | 11/2000 | Schmid et al. |
| 6,160,412 A | 12/2000 | Martel et al. |
| 6,184,576 B1 | 2/2001 | Jones et al. |
| 6,289,583 B1 | 9/2001 | Belmont et al. |
| 6,307,392 B1 | 10/2001 | Soejima et al. |

\* cited by examiner

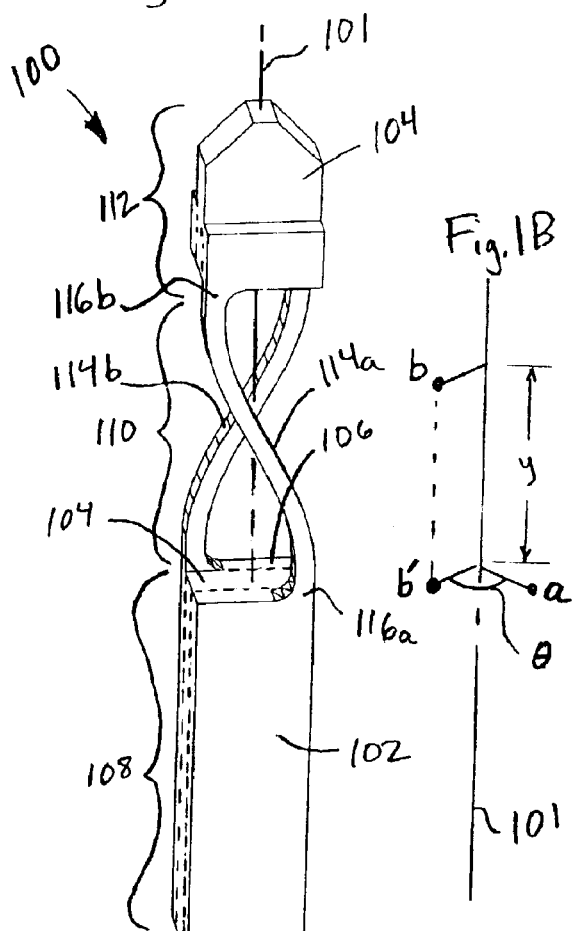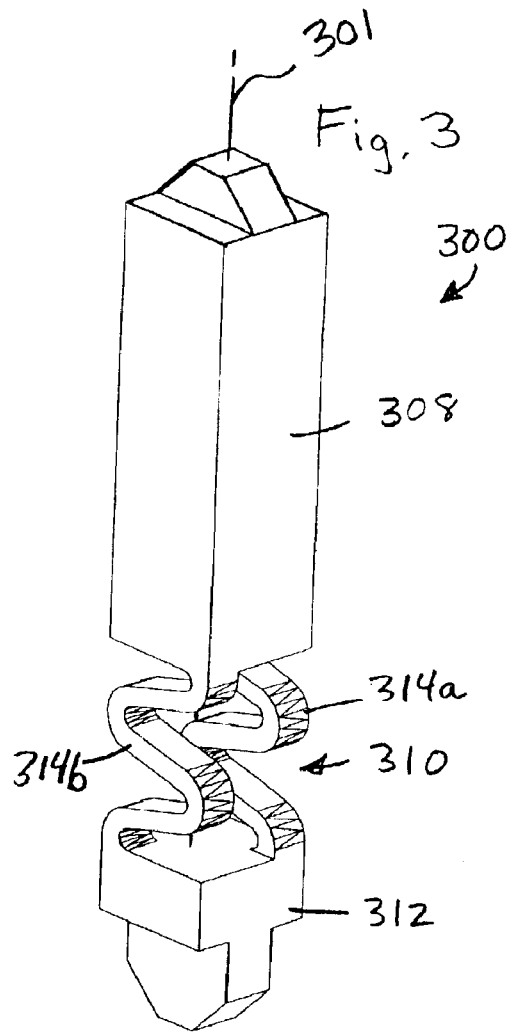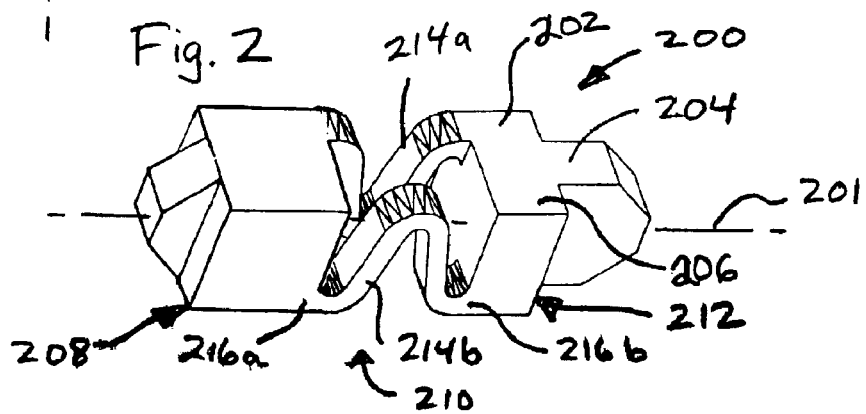

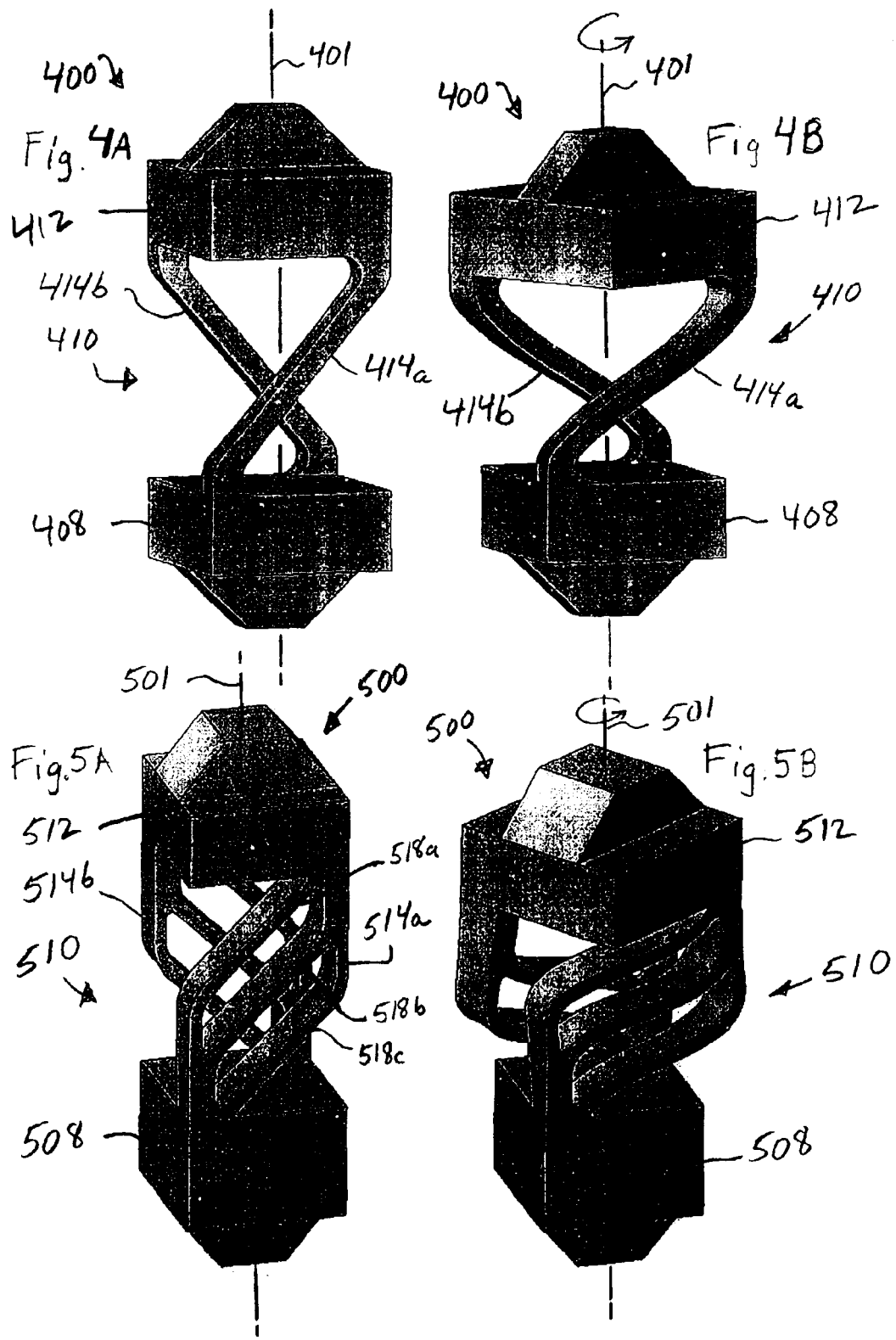

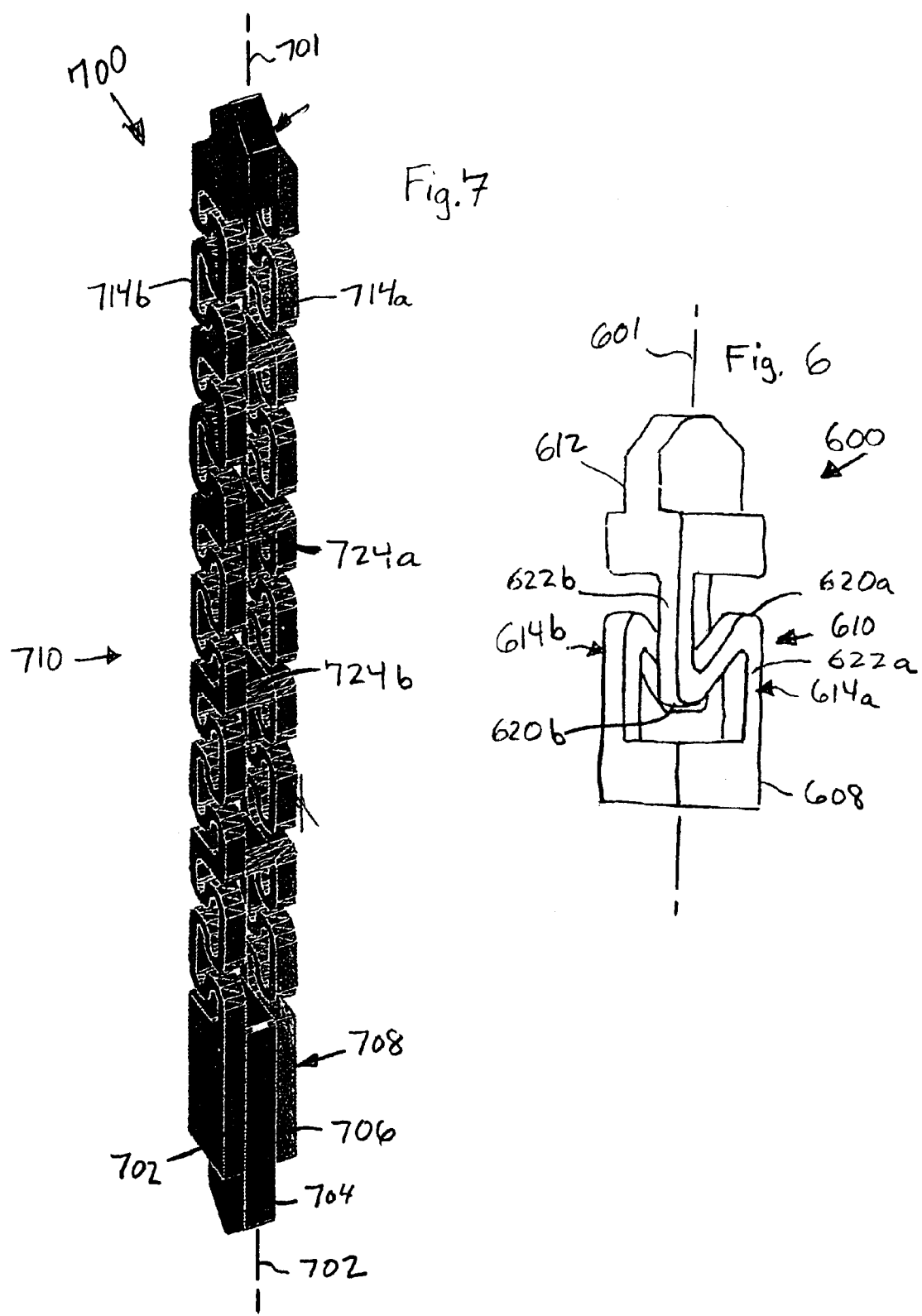

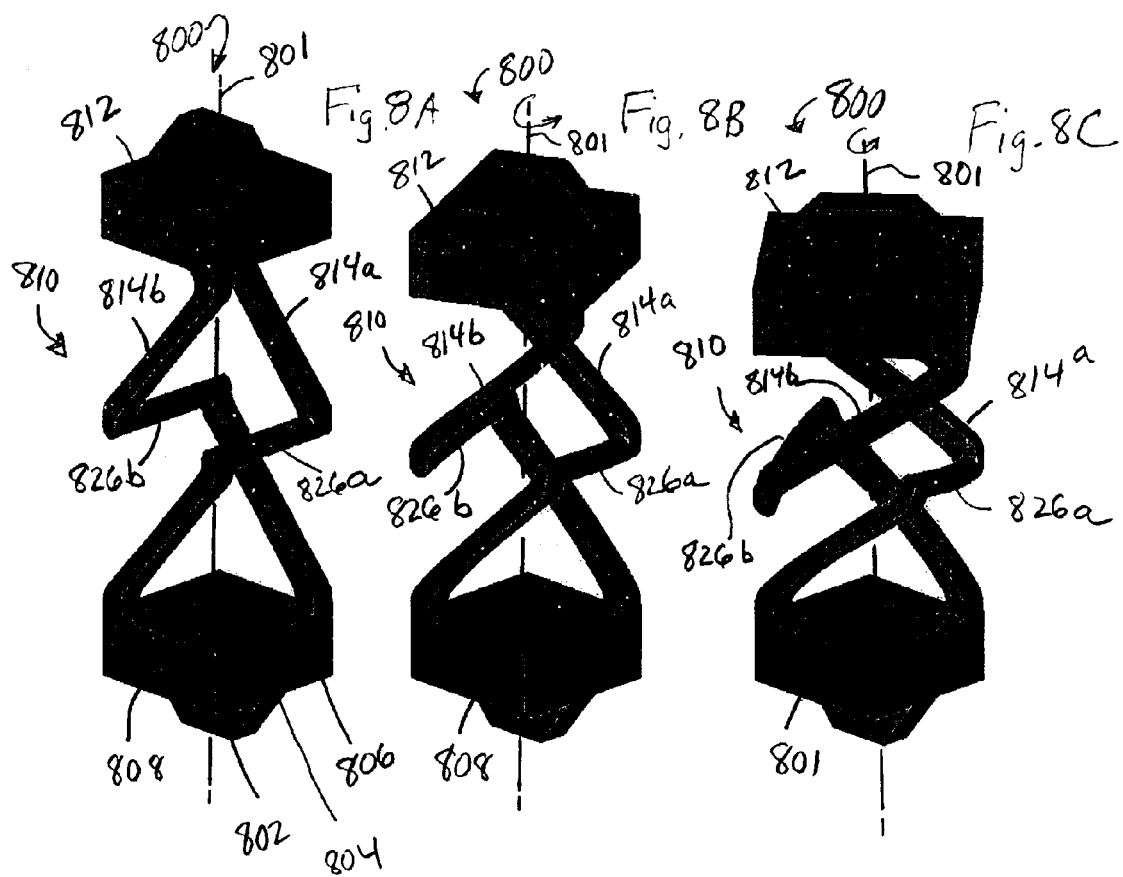

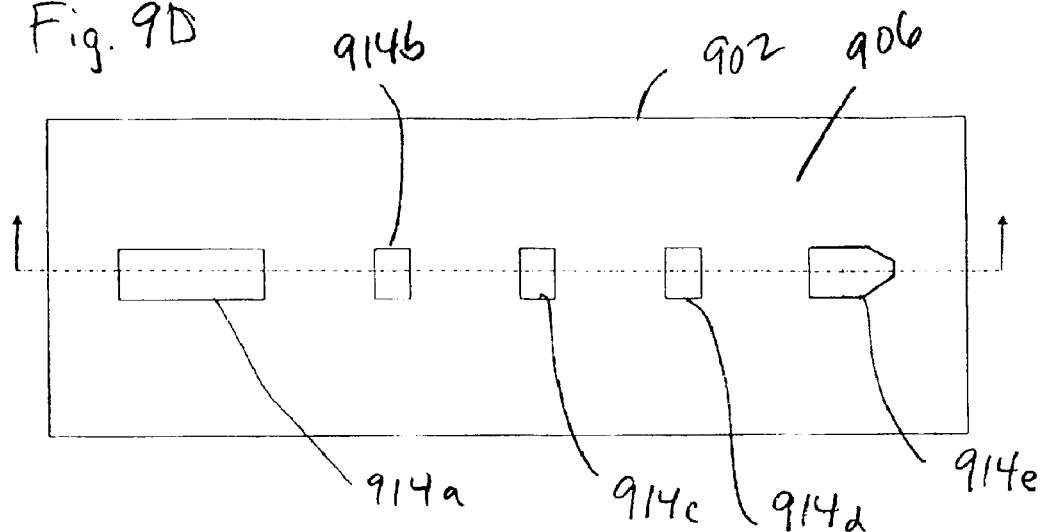
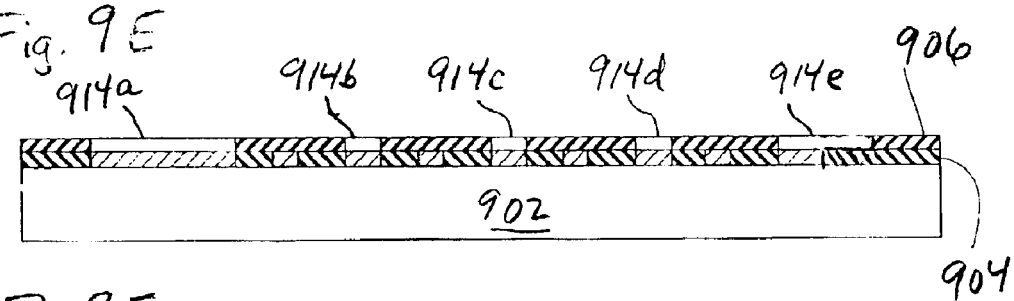
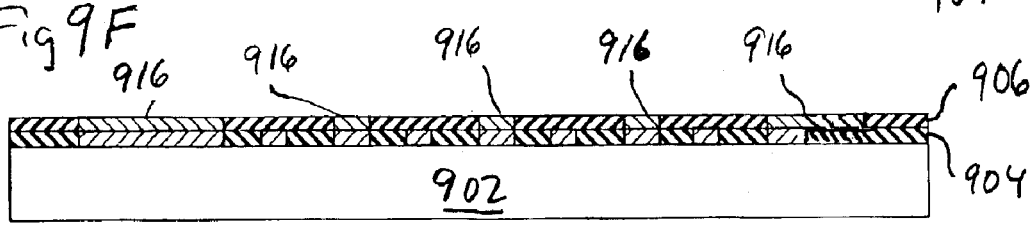

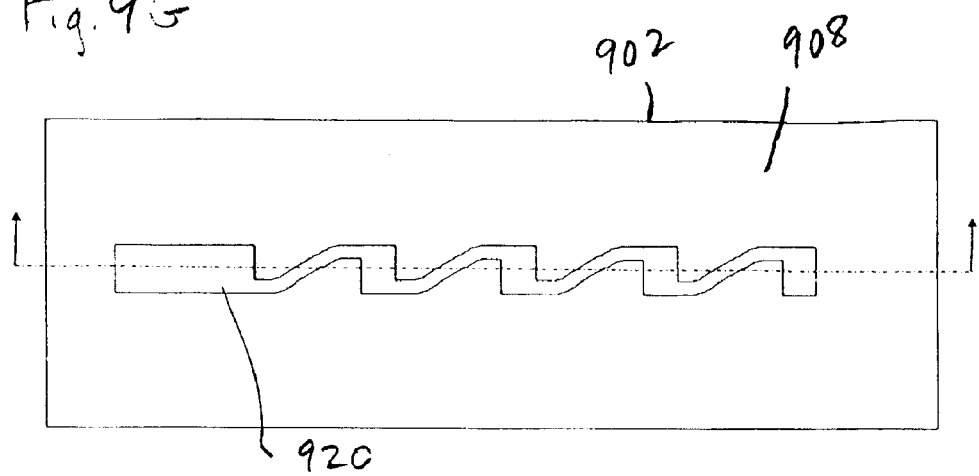
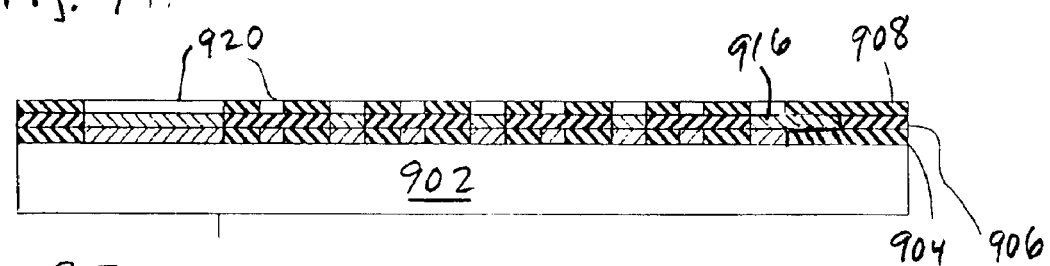
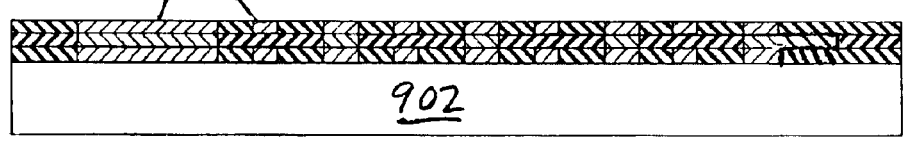

MICROELECTRONIC CONTACT STRUCTURE

BACKGROUND OF THE INVENTION

1. Field of the Invention

The present invention relates to microelectronic spring contact structures such as are used for probing electronics devices during testing or assembly of semiconductor wafers and devices, or for other electrical connector applications.

2. Background

The demand for ever-smaller and more sophisticated electronic components has driven a need for smaller and more complex integrated circuits (ICs). The ever-smaller ICs and high lead counts, in turn, require more sophisticated electrical connection schemes, both for readily demountable applications such as testing and burn-in, and in packaging for permanent or semi-permanent attachment. Generally speaking, the more vertical the electrical connection structures the greater the pitch of an array of the structures. However, vertical electrical connection structures typically provide little to no wiping as the connection structures are brought into contact with pads or leads of an IC or other electronic device. Wiping tends to break through oxide or other contaminates on the pads or leads, improving the electrical connection with the pads or leads.

SUMMARY OF THE INVENTION

The present invention provides microelectronic spring contacts that can be manufactured at small scales using a lithographic formation processes. The spring contacts may be mounted to a contactor in an essentially upright position (i.e., substantially perpendicular to the contactor), thereby facilitating the construction of contact arrays with closely-space contacts. In an embodiment of the invention, the spring contacts are configured to twist when compressed, thereby rotating a contact tip of the contact and providing wipe. The contact may be configured to twist while deflecting only slightly, or not at all, in a lateral direction.

A more complete understanding of the microelectronic spring contact will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

Although the scale of the drawings is arbitrary, it should be appreciated that the drawings are in general greatly magnified views.

FIG. 1A is a perspective view showing an exemplary spring contact according to the invention.

FIG. 1B is a diagram illustrating an arrangement of resilient arms in a structure like that shown in FIG. 1.

FIGS. 2–3 are perspective views showing various exemplary spring contacts according to alternative embodiments of the invention.

FIGS. 4A–4B and 5A–5B are perspective views showing various exemplary spring contacts according to the invention, in compressed and uncompressed states.

FIGS. 6–7 are perspective views showing various exemplary spring contacts according to alternative embodiments of the invention.

FIGS. 8A–8C are perspective views showing an exemplary spring contact according to an embodiment of the invention having resilient arms formed in opposite outer layers that are joined by splices, in progressively greater stages of compression.

FIGS. 9A–9I are plan and cross-sectional schematic views that illustrate exemplary steps of a method for making a spring contact according to the invention.

DETAILED DESCRIPTION OF THE PREFERRED EMBODIMENT

Figure 9A:
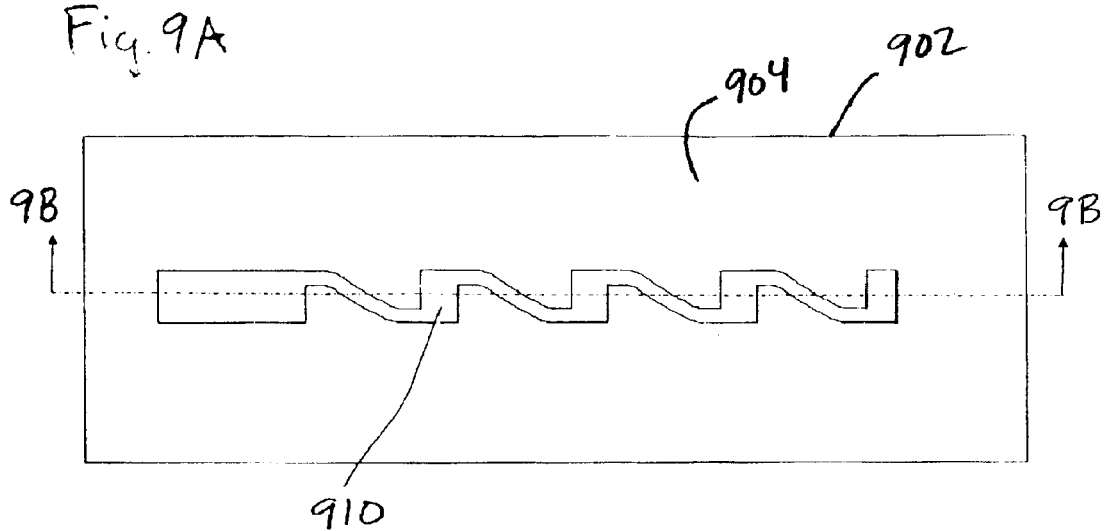

The present invention provides a probe-like contact structure that may be made using a lithographic process. This specification describes exemplary embodiments and applications of the invention. The invention, however, is not limited to these exemplary embodiments and applications or to the manner in which the exemplary embodiments and applications operate or are described herein.

FIGS. 1A to 8C show exemplary variations of a first embodiment of the invention. As shown, each of these exemplary variations comprises a laminate of planar structural layers (indicated by dashed lines in FIG. 1A only), a feature that facilitates manufacturing them using a lithographic process. All of the exemplary structures also comprise a resilient intermediate portion comprised of a plurality of arms. The resilient intermediate portion may be configured to rotate a contact tip of the structure when the structure is compressed in an axial direction. These and other features of the first embodiment will be more apparent from the discussion below.

Specifically with respect to contact structure 100 shown in FIG. 1A, structure 100 may be generally characterized as an elongate, columnar micro-mechanical structure 100 generally disposed along a central longitudinal axis 101. Although there are no particular limits on the scale of a structure according to the invention, it should be appreciated that the structure would generally be utilized at a scale in the range of about 0.05 to 5.0 mm in length, for applications such as electronic contacts. (Of course, the figures are not necessarily to scale.) Structure 100 comprises a plurality of laminated structural layers, such as layers 102, 104, and 106. When assembled as shown, the layers may form an integral structure.

As assembled, the exemplary structure 100 comprises at least three distinct portions: a substantially rigid base portion 108 at a proximal end of structure 100, a resilient intermediate portion 110 extending from the base portion along the central axis 101, and a contact tip 112 supported by the resilient portion 110 at a distal end of structure 100.

Base portion 108 is comprised of central layer 104 and outer layers 102, 106 in a laminated relationship. Base 108 may be any suitable shape for mounting in a contactor assembly, such as a contactor for a probe card. It should be appreciated that structure 100 is suitable for use as contactors for applications such as semiconductor device testing, especially in fine-pitch (closely-spaced) arrays. Generally, probe-like structures according to the invention, such as structure 100, may be arrayed in a variety of different contactors.

Intermediate portion 110 is comprised of a plurality of arms 114a, 114b, that are defined in outer layers 102 and 106, respectively. Each arm 114a, 114b is relatively resilient compared to base 108, and extends between the base and contact tip 112, thereby supporting the contact tip above the base. Arms 114a, 114b may be arranged axi-symmetrically with respect to axis 101. Each arm has two ends. For example, arm 114a has a first end 116a connected to the base and a second end 116b connected to the contact tip.

Arms 114a, 114b may be connected to the contact tip 112 and base 108 such that a second end of each arm is rotated around the central axis 101, with respect to the arm's corresponding first end. FIG. 1B illustrates the geometrical relationship that is implied with respect to axis 101. For example, point "a" represents first end 116a of arm 114a. Correspondingly, point "b" represents the second end 116b of the same arm. Point "b'" shows the position of point b, projected in a line parallel to axis 101 to be in the same plane (i.e., a plane perpendicular to axis 101) as point a. The indicated angle "θ" between b' and a is the amount of angular rotation (i.e., angular displacement) between the ends of the arms. When a substantial angular displacement θ is present between the connected ends of the plurality of arms, the contact tip of structure 100 will rotate around the central axis 101 when the structure is compressed in the direction of axis 101.

In the alternative, arms 114a, 114b may be connected to the contact tip 112 and base 108 such that the second end of each of the plurality of arms is aligned with the first end of each arm, with respect to axis 101. FIG. 2 shows a contact structure 200 according to an embodiment of the invention, having arms 214a, 214b with aligned ends, e.g., 216a, 216b. Like the structure shown in FIG. 1, contact structure 200 is disposed along an axis 201, and is comprised of outer layers 202, 206 and a central layer 204, the layers together making up a base portion 208, a resilient portion 210, and a contact tip 212. Arms 214a, 214b are serpentine to increase the range of resiliency in the direction of axis 201. Unlike structure 100, contact tip 212 of structure 200 should not tend to rotate around axis 201 when an axial compressive force is applied, for applications in which a pure compression action (without rotation) is desired.

The resilient intermediate portion may be configured differently to achieve various performance properties. For example, the relative proportion of axial deflection to rotational deflection may be controlled by varying the configuration of the resilient arms. Indeed, by varying the configuration of the resilient arms, a number of parameters related to the contact structure may be controlled, including without limitation the amount of rotation per unit of compression force; the amount of compression, deflection, and/or buckling per unit of compression force; the spring value (that is the "k" value) of the contact structure; etc. Of course, although the exemplary contact structures 100, 200 (as well as other contact structures described and illustrated herein) show one set of arms in the resilient intermediate portion, multiple sets of arms may be formed, as in FIG. 7.

Contact structure 300, shown in FIG. 3, exemplifies a configuration with serpentine arms in the resilient intermediate portion 310, connecting the base 308 to the contact tip 312. Like contact 100, contact 300 has resilient arms 314a, 314b with opposite ends that are rotated around axis 301 with respect to each other. Like contact 200, the resilient arms are serpentine with a relatively high degree of folding. Accordingly, contact tip 312 revolves around axis 301 when contact 300 is compressed in the axial direction. Also, compared to contact 100, proportionally more axial deflection is associated with each unit of angular deflection.

FIGS. 4A–4B and 5A–5B show rotation of a contact tip around a central longitudinal axis resulting from axial compression. A contact 400 is shown in FIGS. 4A–4B, of a type like contact 100. Like contact 100, opposite ends of arms 414a, 414b of resilient portion 410 are angularly displaced from one another around axis 401. Consequently, when contact 400 is axially compressed, contact tip 412 rotates with respect to base 408 around axis 401. FIG. 4A shows contact 400 in an uncompressed state. FIG. 4B shows contact 400 in a compressed state. Rotation of tip 412 relative to base 408 is apparent.

A similar contact 500 is shown in FIGS. 5A–5B, in uncompressed and compressed states, respectively. Arms 514a, 514b of resilient portion 510 are divided into a plurality of parallel branches, e.g., branches 518a–c. This may permit somewhat different performance properties. Rotation of tip 512 relative to base 508 is apparent in FIG. 5B.

Further examples of various contact structures generally of the same type as contact 100 are shown in FIGS. 6 and 7. Contact 600 has serpentine arms 614a–b in resilient portion 610 oriented differently from the arms of contacts 200 and 300. Arms 614a–b each include two spaced apart vertical portions, such as vertical portions 622a and 622b. More exactly, the vertical portions are columns aligned with axis 601. The configuration shown in FIG. 6 may advantageously provide a hard stop to axial compression before plastic deformation of arms 614a–b can occur. When fully compressed in the direction of axis 601, arms 614-ab may contact base 608 and the bottom of tip portion 612 at their bends. For example, bend 620a may contact the bottom of tip 612 and bend 620b may contact the top of base 608. When this occurs, compressive load is transferred to the four vertical portions of arms 614a–b. The vertical portions of the arms may act as four relatively stiff columns, stopping further axial compression.

Contact 700, shown FIG. 7, comprises arms 714a, 714b that also have vertical portions, than is, column portions aligned with axis 701. Although all of the embodiments described thus far are also layered structures, the layered structure of contact 700, comprised of a central layer 704 and outer layers 702, 706, is more distinctly apparent than in FIGS. 1–6. Arms 714a, 714b also include numerous sequential bends, thereby increasing the range of axial deflection for the contact structure 700. Arms 714a, 714b may be held together at intervals by ties formed in the central layer, e.g., bars 724a, 724b. In alternative embodiments, it should be apparent that a similar use of numerous sequential bends, with or without tie bars, may be employed with resilient arms that do not include vertical portions.

FIGS. 8A–8C show a contact 800 according to an embodiment having an intermediate resilient portion 810 with arms 814a, 814b of resilient portion 810 in a double helical configuration. Contact 800 is shown in progressively greater stages of axial compression. Each arm 814a, 814b is defined in both of the opposite outer layers 802, 806, comprising a first portion in layer 802 and a second portion in layer 806, the two portions joined by splices 826a, 826b, respectively. Splices 826a, 826b may be formed in the central layer 804, or may be separate pieces, such as wire splices. The double helical configuration may advantageously provide a greater range of both axial compression in the direction to axis 801, and angular rotation around axis 801.

As should be apparent from the foregoing discussion, variations are available within the scope of the invention. The foregoing examples are supplied by way of example only, and not by way of limitation. An optimal design will in any event depend on the requirements of the specific application. One of ordinary skill should be able to design a suitable layered, columnar contact structure according to the invention to meet the requirements of each specific application. As just one example, portions of the contact structures could be made to buckle, that is, a portion of the contact structure may move off of a central axis of the contact structure, (in addition to rotating and/or compressing) in a controlled manner by varying one or more properties of the contact structure at selected locations. For example, one of a pair of arms in the resilient portion of a contact structure may be made stronger than the other arm, causing the contact structure to buckle in the direction of the weaker arm.

Figure 9B:
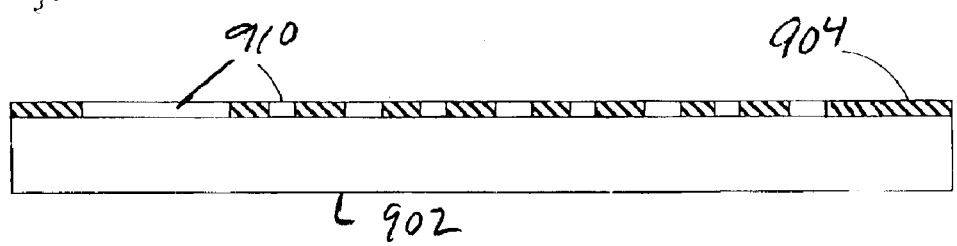

FIGS. 9A–9I illustrate an exemplary method for making layered contact structures according to the invention. As shown in FIGS. 9A–9B, in an initial step, a first masking layer 904 is formed over a sacrificial substrate 902, and a patterned recess 910 in the shape of an outer layer of the desired contact structure is formed, such as by photolithography.

To facilitate eventual release of the contact structure from the sacrificial substrate, the surface of the sacrificial substrate 902 may be prepared by coating with a release layer as known in the art, before applying the first masking layer 904. The release layer is a material that is readily etched away. Suitable release materials include copper, gold, aluminum, titanium-tungsten, and polymers.

Figure 9C:
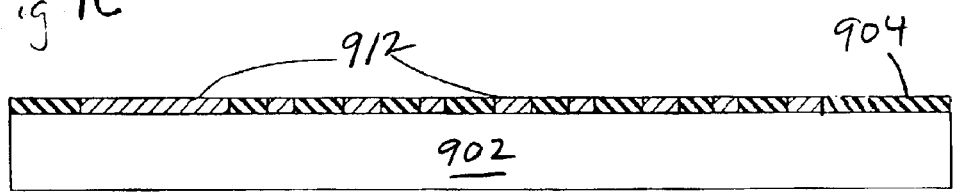

As shown in FIG. 9C, the opening 910 in the first masking layer 904 is filled with a structural material 912 to form the first outer layer of the contact structure. Any suitable deposition method may be used to deposit the structural material in the opening, including electroplating, chemical vapor deposition, sputter deposition, electroless plating, electron beam deposition, thermal evaporation. If electroplating is used, it may be desirable to deposit a shorting (seed) layer on the sacrificial substrate just under the first masking layer. The structural material 912 is preferably a conductive spring material, such as palladium, gold, rhodium, nickel, cobalt, silver, platinum, conductive nitrides, conductive carbides, tungsten, titanium, molybdenum, rhenium, indium, osmium, rhodium, copper, refractory metals, and their alloys (including any combination of two or more of the foregoing materials), and similar materials. The top surface of the masking layer 904 and material 912 deposited in the opening 910 may be planarized by, for example, grinding, polishing, lapping, etc.

The above process is then repeated one or more times to form one or more additional layers. In the example shown, the process is repeated two more times, forming a central layer, and a second outer layer of the contact structure. As illustrated by FIGS. 9D–9F, a second masking layer 906 is deposited over the first masking layer 904. A recess or recesses 914a–e are made in the second masking layer directly over the material layer 912, patterned in the desired shape of the central layer of the contact structure. These recesses are then filled with a suitable structural material 916, which may be the same as material 912, or a different material. Structural layers 912 and 916 should adhere firmly to one another. Optionally, the upper surface of structural layer 912 may be treated prior to filling recesses 914a–914e with structural material 916 to promote adhesion of material 916 to material 912. For example, the surface of material 912 may be roughened, or a layer of an adhesion material may be applied to the surface of material 912. Also, another shorting (seed) layer may be applied to upper surfaces of first masking layer and/or material 912 to promote depositing material 916 by electroplating. Once material 916 has been deposited, the upper surface of material layer 916 and masking layer 906 may be planarized to prepare for the next layer, as before.

As illustrated by FIGS. 9G–9I, a third masking layer 908 is deposited over the second masking layer 906. A recess or recesses 920 are formed in the third masking layer directly over the central material layer 916, and patterned in the desired shape of the second outer layer of the contact structure. Recesses 920 are then filed with a third structural material layer 922. Structural material 922 may be the same as materials 912, 916, or a different material. Again, surfaces of second masking layer 906 and material 916 may be treated to promote adhesion of material 922 to material 916, and/or a shorting (seed) layer may be applied to surfaces of second masking layer 906 and material 916 to promote depositing material 922 by electroplating.

The masking layers 904, 906, 908 are removed, and a finished contact structure is released from the sacrificial substrate, which in the case of the example at hand, would resemble contact 100 shown in FIG. 1 but with additional sets of arms 114a, 114b. The contact structure may be further processed after being released from the sacrificial substrate. For example, it may be plated with one or more coatings that impart additional strength, resiliency, corrosion resistance, and/or electrical conductivity. Of course, each layer may be independently processed. For example, a coating may be applied to each layer after it is formed. Of course, such coatings may be applied before depositing the structural material to coat the underside of the structural material, or coatings may be deposited so as to coat both the top and bottom surfaces of a structural material in a layer. A plurality of such contact structures may then be assembled into a probe array, such as by using any of the techniques described in the commonly-owned U.S. patent application Ser. No. 10/202,712, filed Jul. 24, 2002, which is incorporated herein by reference.

Note that removable tabs (not shown) may be formed on the contact structures to facilitate handling. Also, a plurality of such contact structures may be formed at the same time, and temporary interconnections may be formed to hold them together during handling and/or assembly. Note also that part of the contact structure may be made of a different contact material than another part of the contact structure. For example, the steps illustrated in FIGS. 9D–9F could be performed in two or more substeps. As just one example, in a first substep, an initial second masking layer 906 is applied and patterned to have only recess 914e, which defines the tip of the contact structure. Then, recess 914e is filled with a tip material, and the initial second masking layer is stripped. In a second substep, a new subsequent second masking layer 906 is applied and patterned to have recesses 914a–914d, and those recesses are then filled with the contact structure material. This would ultimately yield the same shaped contact structure, but the tip would be of a different material than the rest of the contact structure.

In the alternative, the contact tip of a different material could be formed in an initial layer, prior to layer 912, resulting in a contact tip in an outer layer of the resulting contact structure. A contact tip in an outer layer may be especially suitable for contact structures that are to be used in a buckling mode or a combination of buckling and twisting, as the contact force at the tip may not be in line with the central axis of the column contact.

FIGS. 10A–10F illustrate another exemplary method for making a layered contact structure. The illustrated example shows the making of a contact structure similar to the contact structure 800 shown in FIG. 8A in which arms 814*a*, 814*b* in the resilient portion 810 of the contact structure 800 are formed in more than one layer. In the resulting contact structure 800, an arm 814*b* has one end on one layer 802 and another end in another layer 806.

Figure 10A:
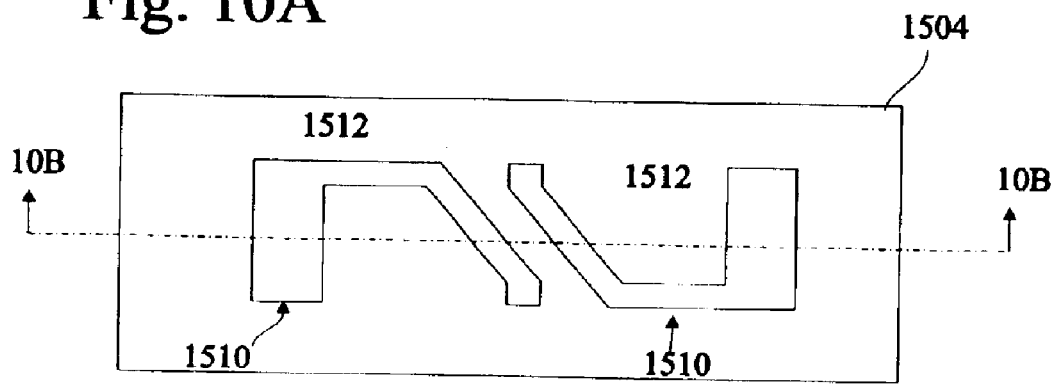
FIGS. 10A–10F are plan and cross-sectional schematic views that illustrate exemplary steps of another method for making a spring contact according to the invention.
Figure 10B:
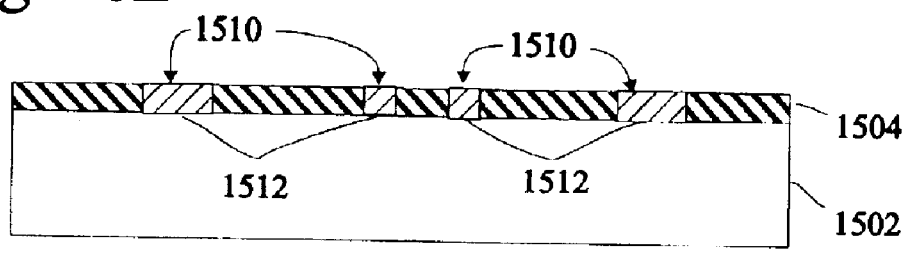

FIGS. 10A and 10B illustrate formation of a first layer 802 of the contact structure 800 illustrated in FIG. 8A. As shown in FIGS. 10A and 10B, a first masking layer 1504 is applied to a sacrificial substrate 1502, and the first masking layer is patterned to form recesses 1510 defining the first layer of the contact structure. The recesses 1510 are then filled with a first structural material 1512, forming the first layer of the contact structure. As should be apparent, part of the contact tip 812, parts of the arms 814*a* and 814*b*, and part of the base 808 (see FIG. 8A) are formed in this first layer.

Figure 10C:
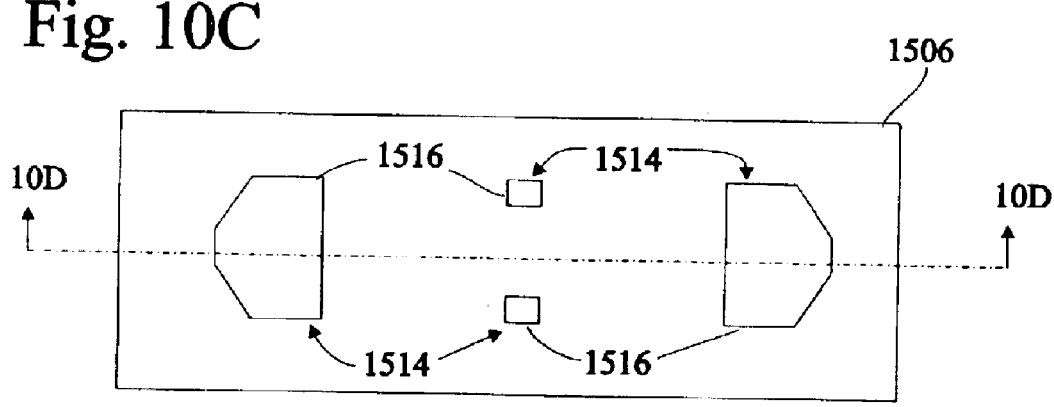
Figure 10D:
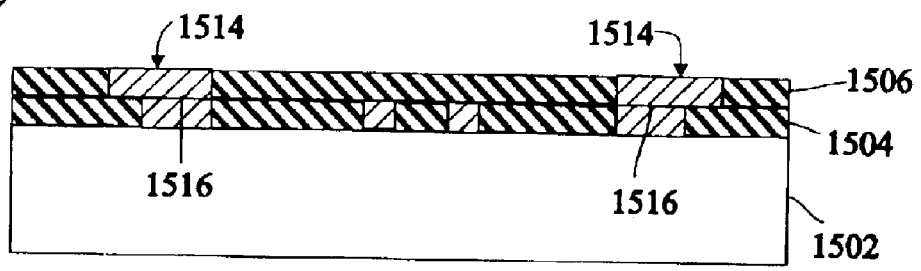

FIGS. 10C and 10D illustrate formation of a second layer 804 of the contact structure 800 illustrated in FIG. 8A. As shown in FIGS. 10C and 10D, a second masking layer 1506 is applied over the first masking layer 1504 and first structural material 1512. The second masking layer 1506 is patterned to form recesses 1514 defining the second layer of the contact structure to be formed, and the recesses 1514 are filled with a second structural material 1516, forming the second layer of the contact structure. This second layer 804 of the contact structure 800 includes part of the contact tip 812, the slices 826*a*, and 826*b*, and part of the base 808 (see FIG. 8).

Figure 10E:
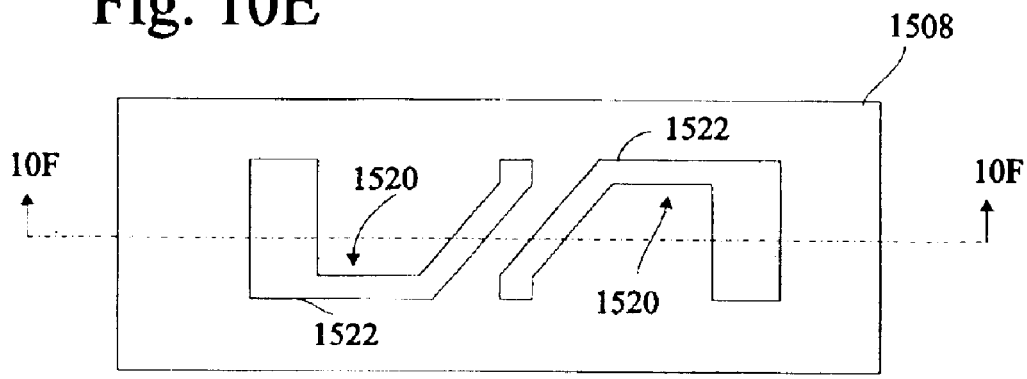
Figure 10F:
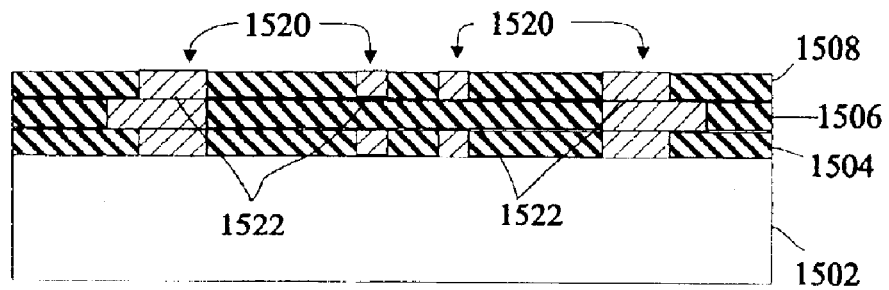

FIGS. 10E and 10F illustrate formation of the third layer 806 of the contact structure 800 illustrated in FIG. 8A. As shown in FIGS. 10E and 10F, a third masking layer 1508 is applied over the second masking layer 1506 and first structural material 1516, and the third masking layer 1508 is patterned to form recesses 1520 defining the third layer of the contact structure to be formed. The recesses 1520 are then filled with a third structural material 1522, forming the third layer 806 (see FIG. 8A) of the contact structure 800 in FIG. 8A. Referring still to FIG. 8A, this third layer 806 of the contact structure 800 includes part of the contact tip 812, parts of arms 814*a* and 814*b*, and part of the base 808. Of course, the structural material deposited in the recesses in each layer may be the same or different layer-to-layer.

Figure 11A:
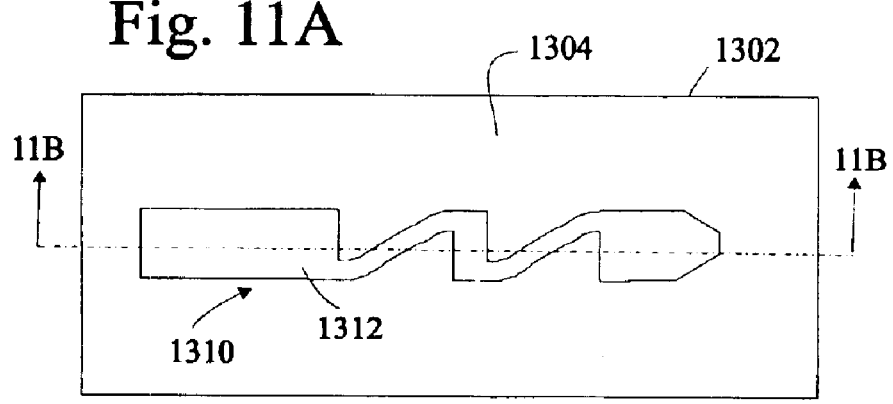
FIGS. 11A–11F are plan and cross-sectional schematic views that illustrate exemplary steps of yet another method for making a spring contact according to the invention.
Figure 11B:
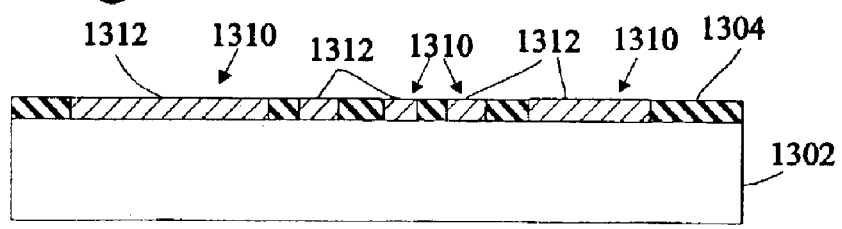

FIGS. 11A–11H illustrate another exemplary method for making layered contact structures in which the resulting contact structure includes only two layers. FIGS. 11A and 11B illustrate formation of the first layer of the contact structure. As shown, FIGS. 11A and 11B illustrate steps of applying a first masking layer 1304 over a sacrificial substrate 1302, patterning the first masking layer to form a recess 1310, and filling the recess 1310 with a first structural material 1312.

Figure 11C:
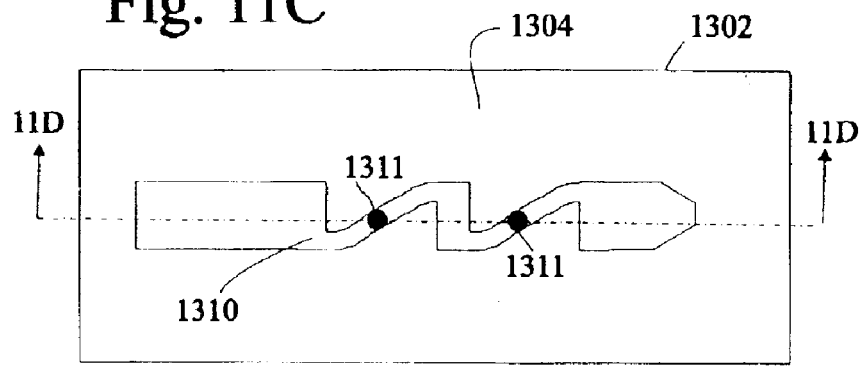
Figure 11D:
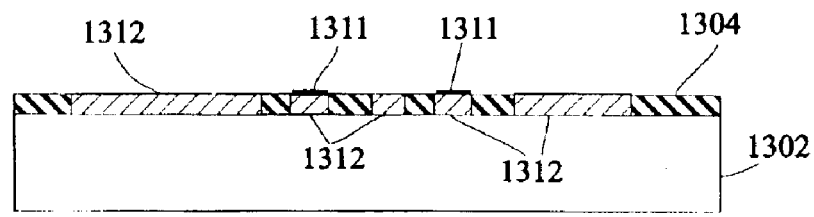
Figure 11E:
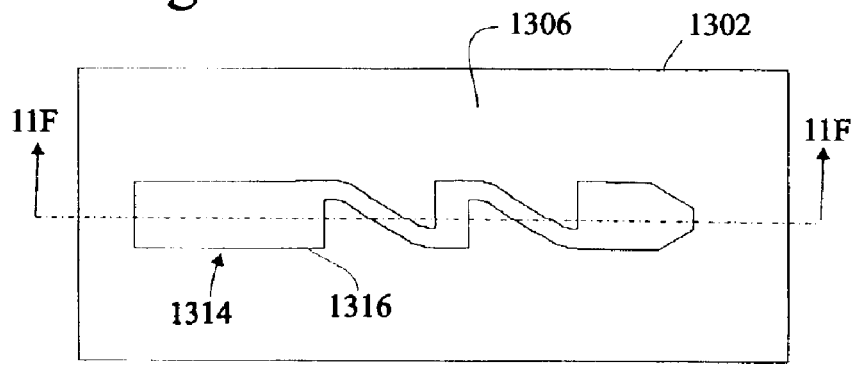
Figure 11F:
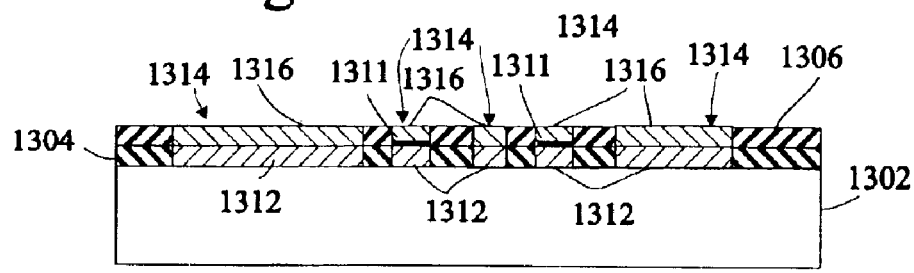

As shown in FIGS. 11C and 11D, material 1311 for preventing adhesion to structural material 1312 is deposited on portions of structural material 1312 corresponding to the arms of the resulting contact structure. The adhesion-prevention material 1311 may be a lubricant, a sacrificial material that is readily etched away, etc. Moreover, the adhesion-prevention material 1311 may alternatively be applied to all of the area corresponding to the arms of the resulting contact structure. As another alternative, material promoting the adhesion of a second layer of structure material 1316 may be applied to the surface of the first layer of structural material 1312 everywhere except for all or a portion of the arms.

Thereafter, the second layer of the contact structure is formed, as illustrated in FIGS. 11 E and 11 F. As shown, a second masking material 1306 is applied over the first masking layer 1304, the second masking layer 1306 is patterned to form recess 1314, and recess 1314 is filled with a second structural material 1316 (which may be the same as or different than the first structural material 1314). The masking layers 1304, 1306 are then removed, and the resulting contact structure is released from the sacrificial substrate 1302. If an etchable material was used as the adhesion-prevention material 1311, it is etched away. The resulting exemplary contact structure may be generally similar to the contact structure 100 illustrated in FIG. 1A but without inner layer 104. (Of course, the example shown in FIGS. 11A–11F has a resilient, intermediate portion with two sets of arms rather than the one set of arms 114*a*, 114*b* shown in the intermediate portion 110 of the contact structure 100 shown in FIG. 1.)

Figure 12:
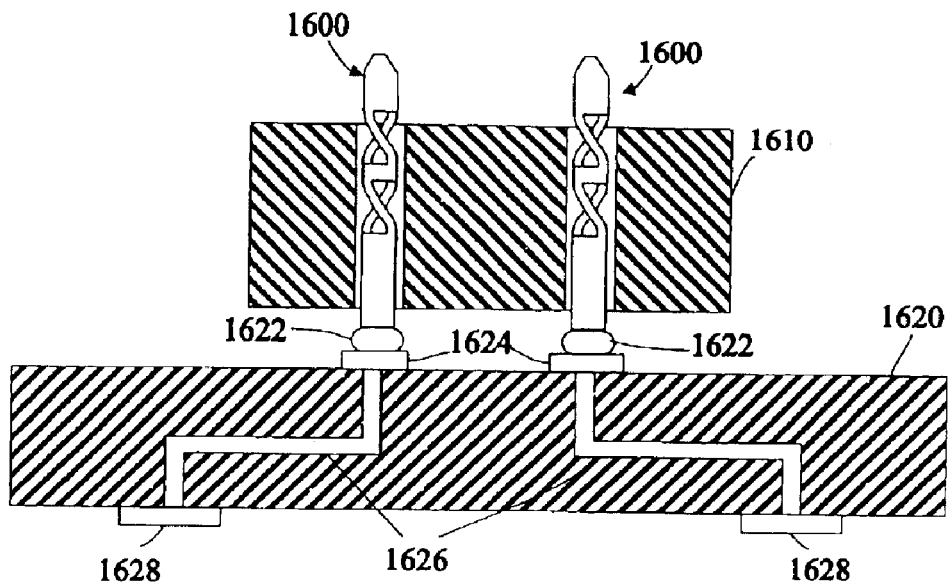
FIG. 12 is a cross-sectional schematic view that illustrates an array of spring contacts for a probing application.

FIG. 12 illustrates an exemplary application of contact structures such as those described above. As shown in FIG. 12, an array of contact structures 1600, which preferably are of the type that rotate when compressed (as discussed above), are assembled into through holes 1604 in a holding substrate 1610. As also shown in FIG. 12, the base ends of contact structures 1600 may be secured to pads 1624 of a space transformer substrate 1620 by solder 1622 or other means (e.g., brazing, welding, adhesives, etc.). As shown, space transformer substrate 1620 has corresponding pads 1628 and conductive interconnections 1626 electrically connecting pads 1624 to pads 1628. Space transformer substrate 1620 may itself be assembled into a larger apparatus. For example, space transformer substrate 1620 may take the place of space transformer 506 in FIG. 5 of U.S. Pat. No. 5,974,662, which is incorporated in its entirety herein by reference. Holding substrate 1610 may be secured to space transformer substrate 1620 by any suitable means, including brackets, clamps, adhesive materials, etc. Also, a plurality of holding substrates 1610 may be secured to one space transformer substrate 1620 to make a large array of contact structures 1600. In addition, the through holes may optionally be coated with a conductive material. Thus, as described above, the contact structures 1600 may optionally be designed to buckle and contact the conductive sides of the through holes, potentially decreasing the electrical resistance through the contact structure.

Figure 13:
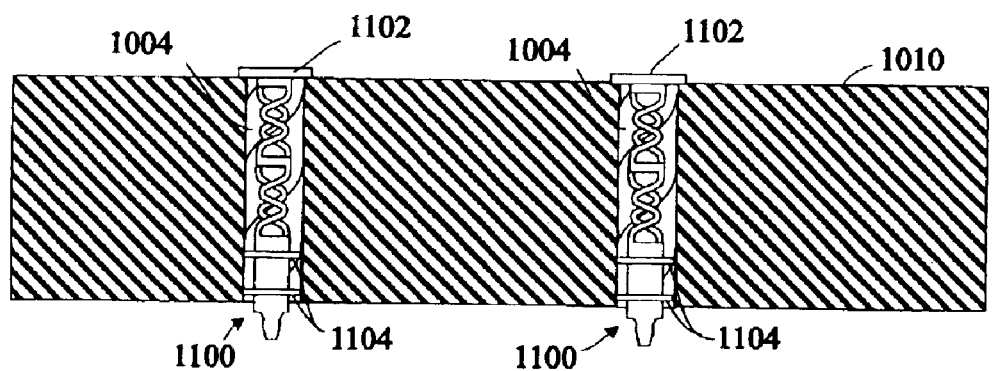
FIG. 13 is a cross-sectional schematic view that illustrates a substrate with threaded through holes for holding an array of spring contacts.

FIG. 13 illustrates an alternative exemplary holding substrate 1010 in which through holes 1004 are threaded. Contact structures 1100 include thread engaging portions 1104 for engaging the threads in through holes 1004. As shown, contact structures 1100 also include an anchor portion 1102. (It should be apparent that contact structures 1600 illustrated in FIG. 12 could also include an anchor portion.) When a force is applied on the tips of contact structures 1100, compressing the contact structures, the contact structures rotate as the thread engaging portions 1104 move up in the threaded through holes 1004. In this manner, even contact structures 1100 that are structurally designed to compress but not to rotate (see the discussion above regarding FIGS. 1–8) can be made to rotate. Note that such rotation is fixed by the threading.

FIGS. 14A–14E illustrate an exemplary method of making a holding substrate with threaded through holes, such as holding substrate 1010.

Figure 14A:
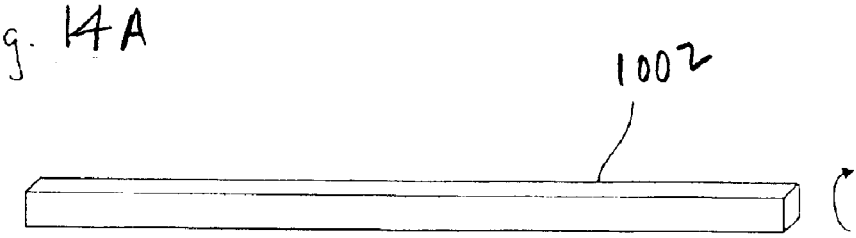
FIGS. 14A–14E are perspective views that illustrate exemplary steps of a method for making threaded through holes.

As shown in FIG. 14A, a bar 1002 of a material that is readily etched away is coated with a material that will form the threaded tubes. For example, the bar 1002 may be formed of copper and the coating may be rhodium. However, the bar 1002 and the coating may be any material, including nonmetal materials. Bar 1002 may have any cross-sectional dimension, including without limitation round, square, rectangular, polygonal, etc. As will be seen, the bar will be etched away, leaving a tube formed of the coating material. To increase the inner diameter of the tube, one or more intermediate coating layers may be formed on the bar prior to the final coating layer that will form the tube. The intermediate coating layers may be etched away with the bar. Alternatively, intermediate coatings may be kept in place. For example, a first intermediate coating comprising a lubricant may form the inner walls of the final tube so that the tube has lubricated inner walls. Of course, any permanent coatings may be further processed (before or after etching away the bar 1002) to achieve desired properties. For example, additional coatings may be added to improve strength, protect against corrosion, improve electrical conductivity, improve adhesion, etc.

Preferably, the bar 1002 is twisted before applying the final coating. Of course, the bar 1002 may be held in its twisted position while one or more coatings are applied.

Figure 14B:
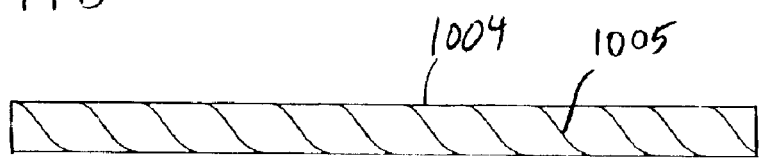

As shown in FIG. 14B, the coated, twisted bar 1004 forms a thread-like spiral pattern 1005. A bar with a single direction of twist is shown, but it may also be desirable to impart two or more reversing directions of twist to the bar. The thread-like spiral pattern that is created by the twisting will eventually become the threads of a tube for imparting rotation to a contact tip.

Figure 14C:
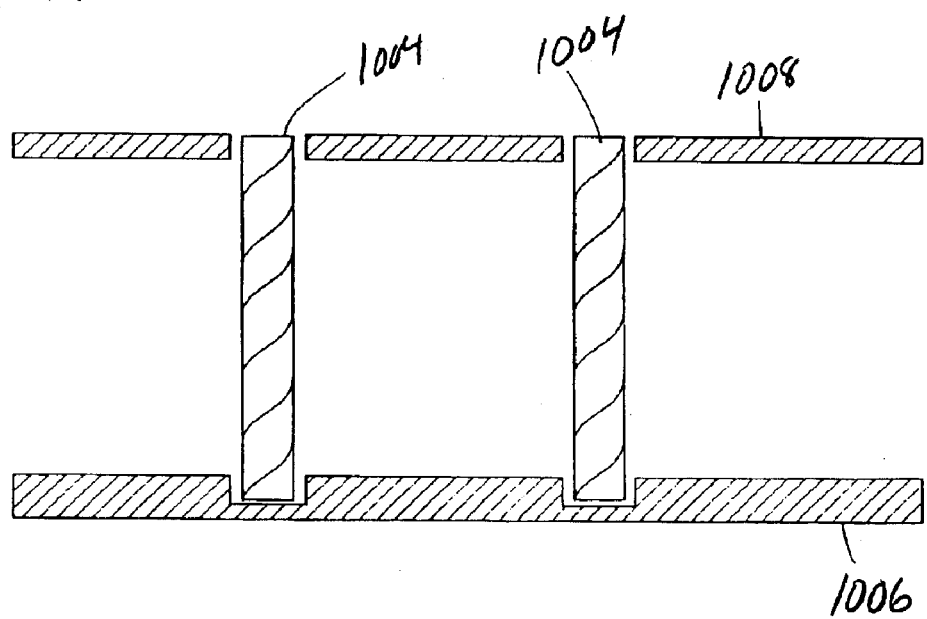
Figure 14D:
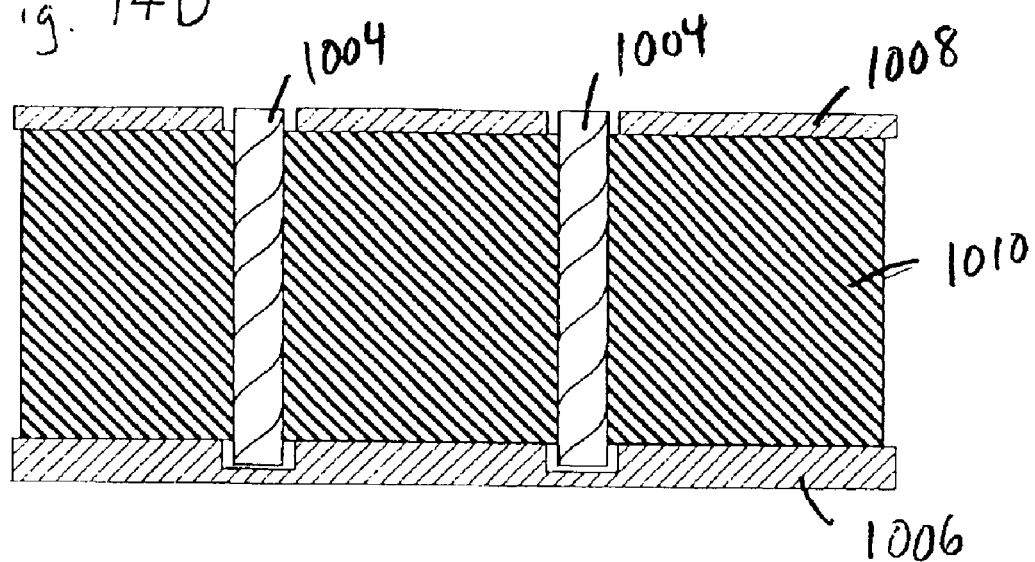

As shown in FIG. 14C, the twisted bar is cut into pieces 1004 (any number of pieces may be cut, two of many shown) and placed in aligned holes or other holding features such as pits, in first and second substrates 1006 and 1008, respectively. As shown in FIG. 14D, a settable substrate material 1010 is then molded between the two substrates 1006, 1008. The two substrates may be clamped together as shown in FIG. 14D (clamps not shown) and then placed into a mold. Alternatively, the two substrates may include side plates that define a mold.

Figure 14E:
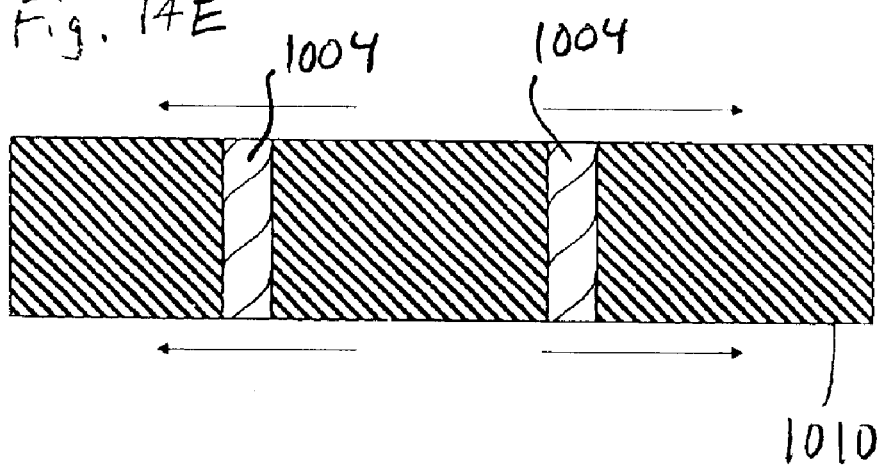

Once the settable substrate material 1010 has set, the first and second substrates 1006, 1008 are removed (e.g., by etching). The bar 1002 and any intermediate coating layers are also etched away. The first and second substrates, bar, and intermediate coatings may be made of the same material so that they are etched away in the same processing step. Optionally, one or both of the top and bottom surfaces of the resulting substrate 1010 may be planarized, as shown in FIG. 14E. In the alternative, one or both of the first and second substrates may be left attached to substrate 1010. For example, a substrate like 1006, but with openings smaller than the inner diameter of tubes 1004 centered over the end of each tube, could be left behind to serve as a retainer for any interior components in the tubes. As yet another alternative, substrate 1006 may be removed (e.g., by etching) without removing the ends of tubes 1004, so that the ends of tubes 1004 extended one or both surfaces of substrate 1010. The tubes thus form threaded through holes in holding substrate 1010.

Figure 15A:
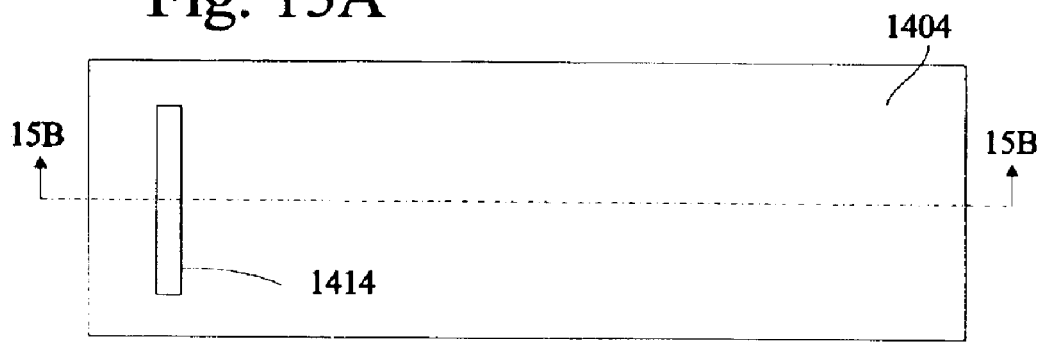
FIGS. 15A–15I are plan and cross-sectional schematic views that illustrate exemplary steps of still another method for making a spring contact according to the invention.
Figure 15B:
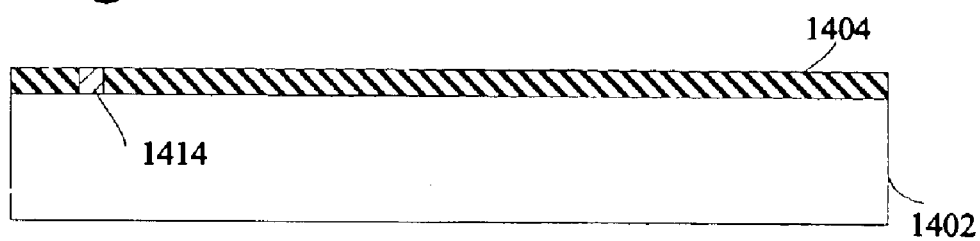
Figure 15C:
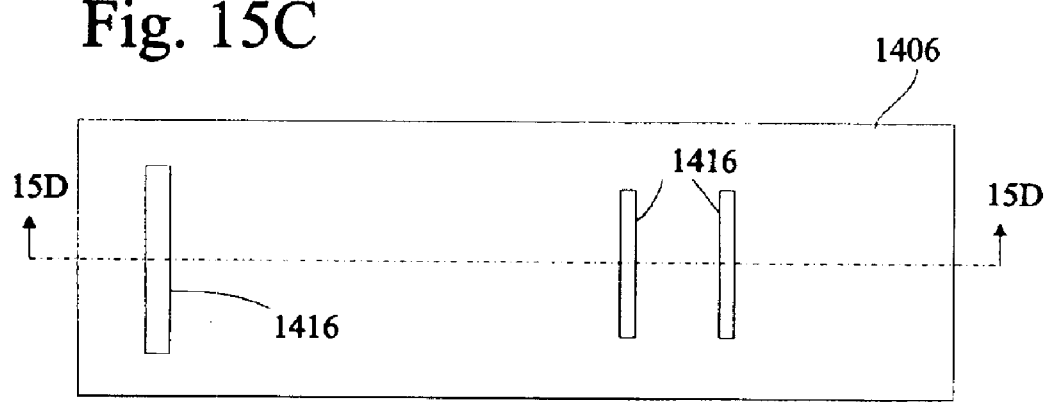
Figure 15D:
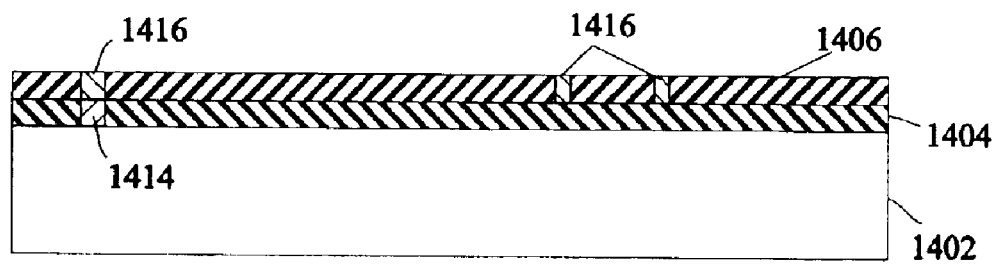
Figure 15E:
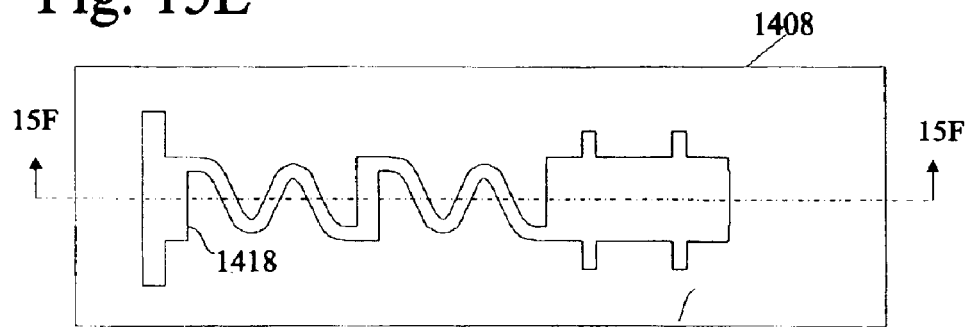
Figure 15F:
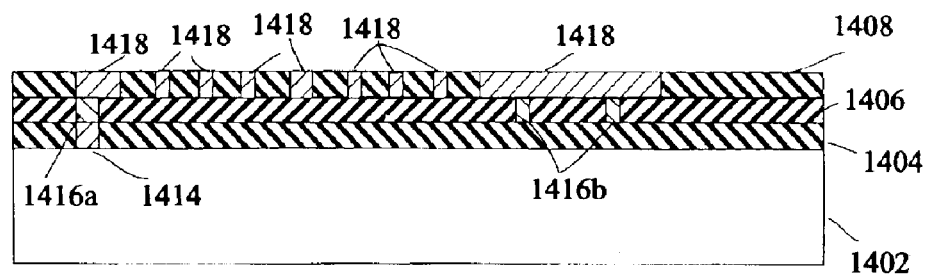
Figure 15G:
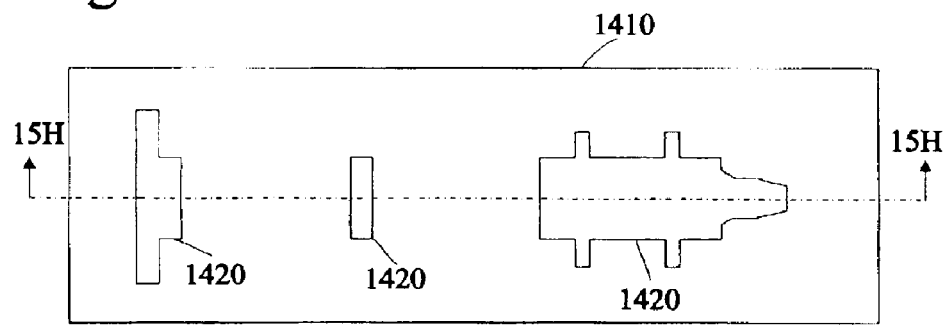
Figure 15H:
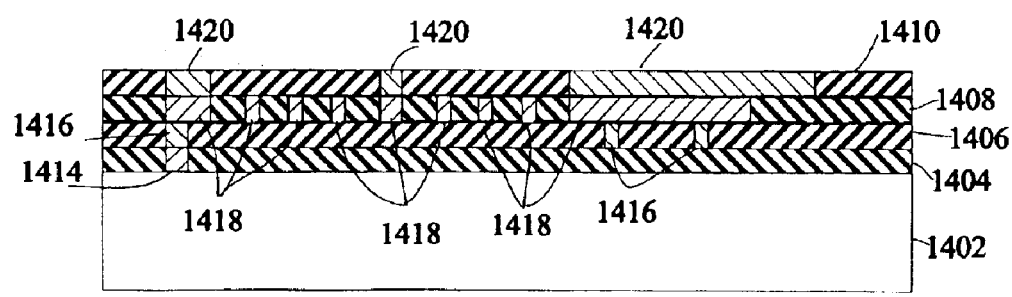
Figure 15I:
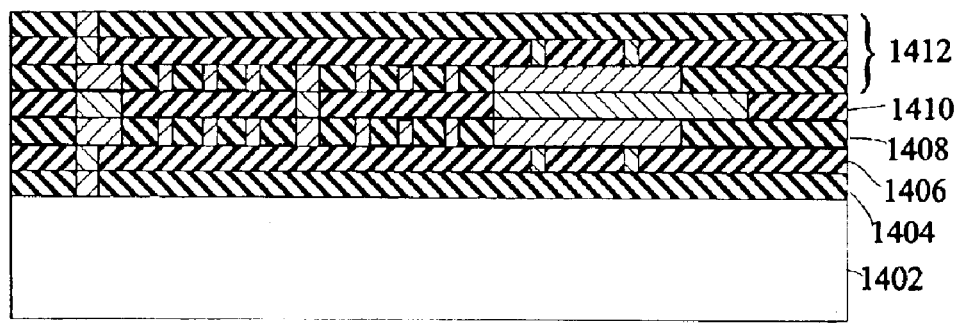

FIGS. 15A–15I illustrate an exemplary method for making contact structures with an anchor portion 1102 and thread engaging portions 1104 (see FIG. 13). FIGS. 15A and 15B illustrate formation of a first layer of the contact structure. As shown in FIGS. 15A and 15B, a first masking material 1404 is applied to a sacrificial substrate 1402. The first masking material is patterned to have a recess, which is filled with a structural material 1414, forming the first layer of the contact structure. The second layer of the contact structure is similarly formed, as illustrated in FIGS. 15C and 15D. As shown, a second masking material 1406 is applied over the first masking material 1404 and first structural material 1414. The second masking material 1406 is patterned to have recesses, which are filled with a structural material 1416, forming the second layer of the contact structure. As shown in FIGS. 15E and 15F, this process is again repeated to form the third layer of the contact structure. That is, a third structural material 1418 fills recesses in a third masking material 1408. FIGS. 15G and 15H illustrate a further repetition in which a fourth layer of the contact structure is formed. As shown, a structural material 1420 fills recesses in a fourth masking material 1410. As shown in FIG. 15I, this process is repeated in three additional layers 1412, until the contact structure 1100 shown in FIG. 12 is completed, after which, all of the masking layers are removed, and the contact structure is released from the sacrificial substrate 1402. Of course, the structural material deposited in the recesses in each layer may be the same or different layer-to-layer. Indeed, each layer may itself be made up of multiple sublayers of differing or altering materials.

As should be apparent, the exemplary processes illustrated in FIGS. 9A–9I, FIGS. 10A–10F, FIGS. 11A–11F, and FIGS. 15A–15I are generally similar, and any of the materials, variations, additional treatments, formation of tips of different materials, use of release and seed layers, use of adhesion promotion, formation of a layer in multiple sublayers of differing materials, etc. discussed or mentioned with respect to any one of the foregoing processes may be implemented in any of the others of the foregoing process.

Having thus described a preferred embodiment of the microelectronic spring contact, it should be apparent to those skilled in the art that certain advantages of the embodiments discussed above have been achieved. It should also be appreciated that various modifications, adaptations, and alternative embodiments thereof may be made within the scope and spirit of the present invention. For example, a spring contact has been illustrated, but it should be apparent that the inventive concepts described above would be equally applicable to other types of rotating structures for other applications. As another example, although the above examples show formation of only one contact structure on a sacrificial substrate, typically many spring contacts will be formed simultaneously on a sacrificial substrate. The invention is defined by the following claims.

What is claimed is:

1. An elongate, columnar micro-mechanical structure disposed along a central longitudinal axis, the structure comprising:
   a plurality of laminated structural layers, each of the layers comprised of a structural material;
   a substantially rigid base portion at a proximal end of the structure;
   a resilient intermediate portion extending from the base portion along the central axis, the resilient portion comprised of a plurality of arms defined in at least two of the plurality of layers; and a contact tip extending from the resilient portion at a distal end of the structure;

wherein the base is comprised of at least a central layer and outer layers of the plurality of layers; and wherein the arms are defined in the outer layers.

2. The structure of claim 1, wherein each of the plurality of arms has a first end attached to the base portion and a second end attached to the contact tip.

3. The structure of claim 2, wherein the second end of each of the plurality of arms is displaced around the central axis with respect to its corresponding first end, whereby the contact tip rotates around the central axis with respect to the base portion, when the structure is compressed in the direction of its central axis.

4. The structure of claim 2, wherein the second end of each of the plurality of arms is aligned with its corresponding first end with respect to the central axis, whereby the contact tip does not rotate around the central axis with respect to the base portion, when the structure is compressed in the direction of its central axis.

5. The structure of claim 2, wherein each of the plurality of arms is defined in an outer layer of the plurality of layers, having the first end and the second end in the one layer.

6. The structure of claim 2, wherein each of the plurality of arms is defined in one layer of the outer layers, having the first end and the second end in the one layer.

7. The structure of claim 2, wherein each of the plurality of arms is defined in opposite outer layers of the plurality of layers, each arm having the first end in one layer of the outer layers, and the second end in an opposite layer of the outer layers.

8. The structure of claim 7, wherein each of the plurality of arms further comprises a portion of a central layer connecting the one layer of the outer layers to the opposite layer of the outer layers.

9. The structure of claim 7, wherein each of the plurality of arms further comprises a spliced portion connecting the one layer of the outer layers to the opposite layer of the outer layers.

10. The structure of claim 1, wherein the plurality of arms defines a double helix shape.

11. The structure of claim 1, wherein each of the plurality of layers is formed by depositing a structural material over a patterned sacrificial layer, and removing the sacrificial layer.

12. The structure of claim 1, wherein the plurality of arms in the resilient portion have a serpentine shape.

13. The structure of claim 1, wherein outer layers of the plurality of layers are connected to each other at a point in the resilient portion intermediate between the base portion and the contact tip.

14. The structure of claim 1, wherein the contact tip comprises an essentially rigid laminate of the plurality of layers.

15. The structure of claim 1, wherein each of the plurality of layers comprises a material selected from nickel, cobalt, and alloys thereof.

16. The structure of claim 1, further comprising a coating of electrically conductive material generally covering the structure.

* * * * *